(12) United States Patent
Walden

(10) Patent No.: US 7,702,119 B2
(45) Date of Patent: Apr. 20, 2010

(54) MULTI-INPUT GAIN CONTROL CIRCUIT

(75) Inventor: Robert W Walden, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 1541 days.

(21) Appl. No.: 10/999,673

(22) Filed: Nov. 30, 2004

(65) Prior Publication Data

US 2006/0126867 A1     Jun. 15, 2006

(51) Int. Cl.
*H04B 1/00*    (2006.01)
*H03F 99/00*    (2009.01)
*H03F 1/36*    (2006.01)
*H03F 1/30*    (2006.01)
*H03F 3/68*    (2006.01)
*H03F 5/00*    (2006.01)
*H02B 1/00*    (2006.01)
*H03G 3/20*    (2006.01)
*H03G 3/00*    (2006.01)

(52) U.S. Cl. .................. 381/119; 381/120; 381/121; 381/123; 330/86; 330/144; 330/147; 330/282

(58) Field of Classification Search ................ 381/119, 381/120, 121, 111–117, 123; 330/86, 144, 330/147, 282, 284; 333/14

See application file for complete search history.

(56) References Cited

U.S. PATENT DOCUMENTS 5,946,608 A * 8/1999 Morita et al. ............... 455/334

* cited by examiner

*Primary Examiner*—Vivian Chin
*Assistant Examiner*—Douglas J Suthers
(74) *Attorney, Agent, or Firm*—Ryan, Mason & Lewis, LLP

(57) ABSTRACT

A method and apparatus for selecting and mixing electronic signals. The circuit has an operational amplifier and two or more ganged, tapped-resistors in which the tap divides the resistance into a first and a second resistance. The tapped-resistors are connected so that either the first or the second resistance provides the effective input resistance for that signal at the operational amplifier. The second resistance of one of the tapped-resistors provides the output resistance for all signals at operational amplifier. As the tapped resistors are equivalent and their taps ganged, when the signals are mixed, those signals whose effective input resistance at the operational amplifier is selected to be the second resistance have unit gain, while those signals whose effective input resistance at the operational amplifier is selected to be the first resistance have a gain equal to the second resistance divide by the first resistance.

25 Claims, 7 Drawing Sheets

MULTI-INPUT GAIN CONTROL CIRCUIT

FIELD OF THE INVENTION

The present invention relates to electronic circuits, and particularly to electronic circuits for mixing signals.

BACKGROUND OF THE INVENTION

Circuits that mix multiple input signals together to form a single output are well known in, for instance, the recording industry. Such circuits typically allow the gain of each input signal to be selected independently of any other input signal. The disadvantage of mixing circuits having such flexibility is that they require a significant number of components. In particular, such a circuit typically requires one operational amplifier for each signal channel being mixed as well as a separate operational amplifier for mixing the signals.

In consumer electronics there are products, such as cell phones, that have multiple audio input sources, including multiple microphone inputs, MP3 inputs and synthesizer inputs for ring tones. It is sometimes desirable to mix two or more of these audio sources into a single output channel, such as a headset phone. For instance, two people conversing by phone may also choose to listen to background music.

The mixing requirements of such consumer electronics mixing circuits are not as stringent as for the music industry as consumer electronics devices typically only require a limited number of circuit selection and mixing capabilities. The first capability that is typically required is the ability to select a channel and to adjust the gain of a signal in that selected channel. The second typically required capability is the ability to select a combination of channels, to mix them into a single output and to apply the same gain to all the signals from the selected channels. The third typically required capability is the ability, when a number of channels are selected and the signals from them mixed, to select a further subset of one or more channels and to apply a uniform gain to the signals from the selected subset while the gain of the signals from the remaining channels remains fixed.

Consumer electronic devices are, however, very price sensitive, making it highly desirable to provide such mixing capability using as few components as possible.

What is therefore desirable are low cost circuits, capable of providing the basic mixing capabilities typically needed by consumer electronics devices. One way of ensuring that the circuits are available at a low cost is to design them using as small a number of electronic components as possible, with particular attention to reducing the number of complex components such as operational amplifiers.

SUMMARY OF THE INVENTION

The present invention relates to methods and apparatus for selecting and mixing electronic signals to meet the needs of electronic consumer products. In particular, the present invention provides mixing circuits that require only one operational amplifier while providing the ability to select a channel and to adjust the gain of the signal in that selected channel.

In addition, the methods and circuits of this invention also enable the selection and mixing of a multiplicity of signals, all of which may have their gain adjusted by an equal amount.

In a preferred embodiment of the invention, the methods and circuits further enable signals from a number of channels to be selected and mixed, and to select a further subset of one or more channels, and to apply a uniform gain to the signals from the selected subset while the gain of the signals from the remaining channels remains fixed.

In one embodiment, this functionality is accomplished using an operational amplifier and two or more ganged, tapped-resistors in which the tap divides the resistance into a first and a second resistance. The tapped-resistors are connected so that the first resistance provides the effective input resistance for that signal at the operational amplifier, while the second resistance of one of the tapped-resistors provides the output resistance for all signals at operational amplifier. In this way, the signals are mixed into a single output and all are amplified by a gain equal to the second resistance divided by the first resistance.

In a further, preferred embodiment, the circuit is further capable of having each input signal have either the first or the second resistance provide the effective input resistance for that signal at the operational amplifier, while the second resistance of one of the tapped-resistors provides the output resistance for all signals at operational amplifier. In this way, as long as the tapped resistors are equivalent and their taps ganged, when the signals are mixed, those signals whose effective input resistance at the operational amplifier is selected to be the second resistance have unit gain, while those signals whose effective input resistance at the operational amplifier is selected to be the first resistance have a gain equal to the second resistance divided by the first resistance.

In further embodiments of the invention, the input signals may be differential signals and the output may be a grounded signal or a differential signal.

These and other features of the invention will be more fully understood by references to the following drawings.

DETAILED DESCRIPTION

The present invention relates to mixing together and adjusting the gain of signals from two or more input channels to form a single output signal in a single output channel. More particularly, the present invention allows the selection and mixing of signals from any combination of input channels, and the subsequent application of the same gain to all the signals from the selected channels. The present invention also allows the mixing of signals from a plurality of channels such that the gain to one or more of the signals from those channels is adjustable while the gain of the signals from the remaining channels remains fixed.

Figure 1:
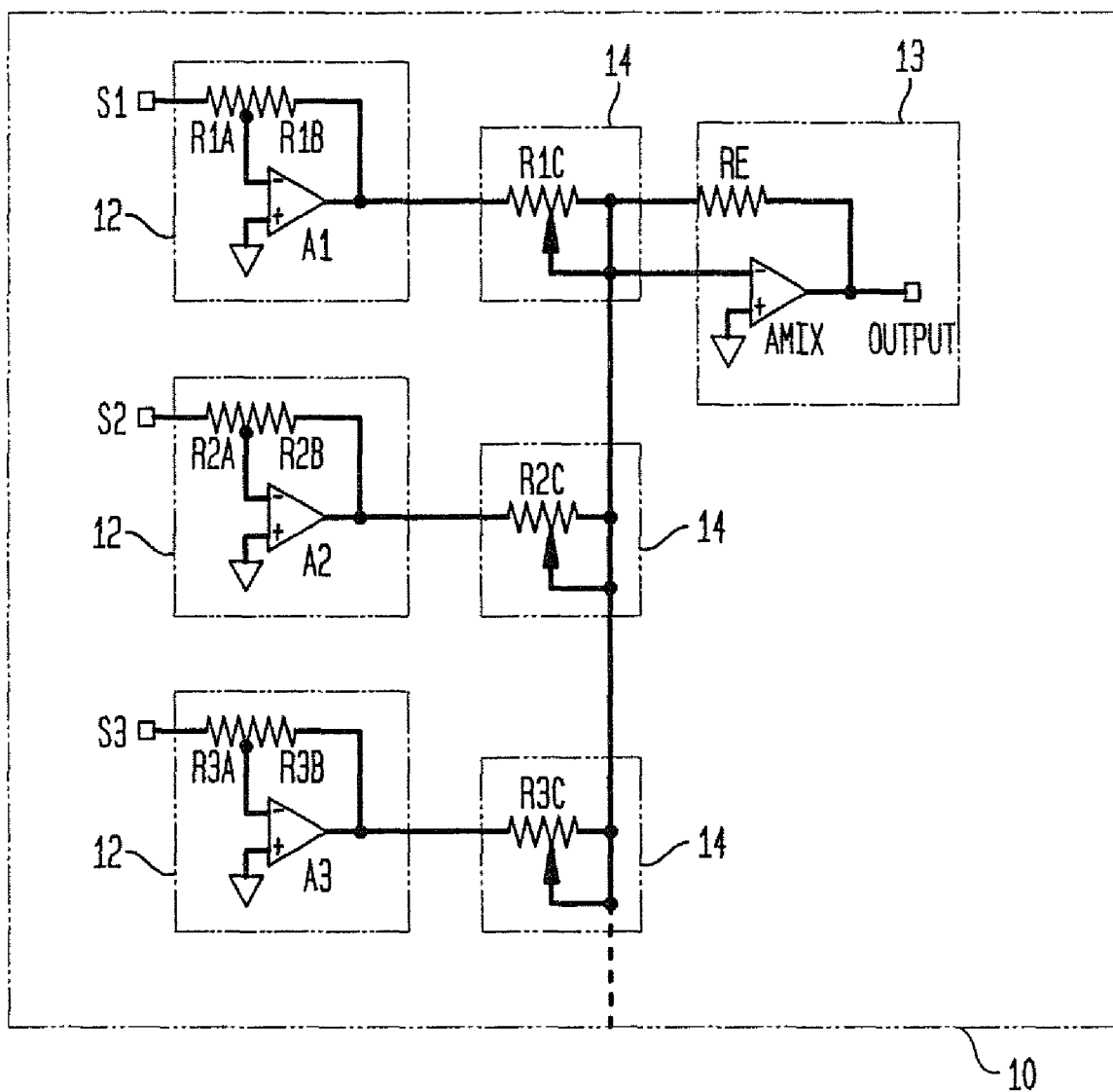
FIG. 1 shows a conventional, independently buffered, high-impedance input, fixed-input-gain mixing circuit.

FIG. 1 shows a conventional, independently buffered, high-impedance input, fixed-input-gain mixing circuit 10, suitable for mixing two or more low-impedance input signals into a single output signal, comprising two or more fixed-gain amplification circuits 12, a variable-gain amplifier back-end 13 and two or more variable-gain amplifier front-ends 14.

Each fixed-gain amplification circuit 12 comprises an operational amplifier A1, A2, A3, input resistors R1A, R2A, R3A and output resistors R1B, R2B, R3B. The operational amplifiers A1, A2, A3 have a grounded non-inverting input. Input resistors R1A, R2A, R3A connect the input terminals S1, S2, S3 to the inverting input of the corresponding operational amplifiers A1, A2, A3. The resistors R1B, R2B, R3B connect the inverting input of the corresponding operational amplifiers A, A2, A3 to their output. Each fixed gain amplification circuit provides a high-impedance buffer to an input signal, inverts that input signal, and amplifies that input signal by an amount equal to the ratio of the resistance of the output resistor to the input resistor, i.e., an amplification gain of R1B/R1A, or equivalent.

The back-end 13 of a variable-gain amplifier comprises an operational amplifier AMIX, a resistor RE and an output terminal. The non-inverting input of operational amplifier AMIX is grounded. The resistor RE connects the inverting input of operational amplifier AMIX to the output terminal.

The front-ends 14 of the variable-gain amplifier each comprise a variable resistor connected so that signals applied at terminal S1, S2, S3 have corresponding resistance values R1C, R2C, R3C as the input resistance of the variable amplifier. The output signal is therefore a mixture of the signals applied at input terminals S1, S2, S3, each amplified by the corresponding ratio R1B·RE/(R1A·R1C), R2B·RE/(R2A·R2C), and R3B·RE/(R3A·R3C). In general, for an input signal N, if RNA is equal to RNB, then each input signal N is amplified by an amount RE/RNC.

An advantage of such a conventional, independently buffered, high-impedance input, fixed-input-gain mixing circuit 10 is that the gain of the signal from each input channel can be adjusted independently. A disadvantage, however, is that each input channel requires an operational amplifier in addition to the operational amplifier that performs the final mixing.

Figure 2:
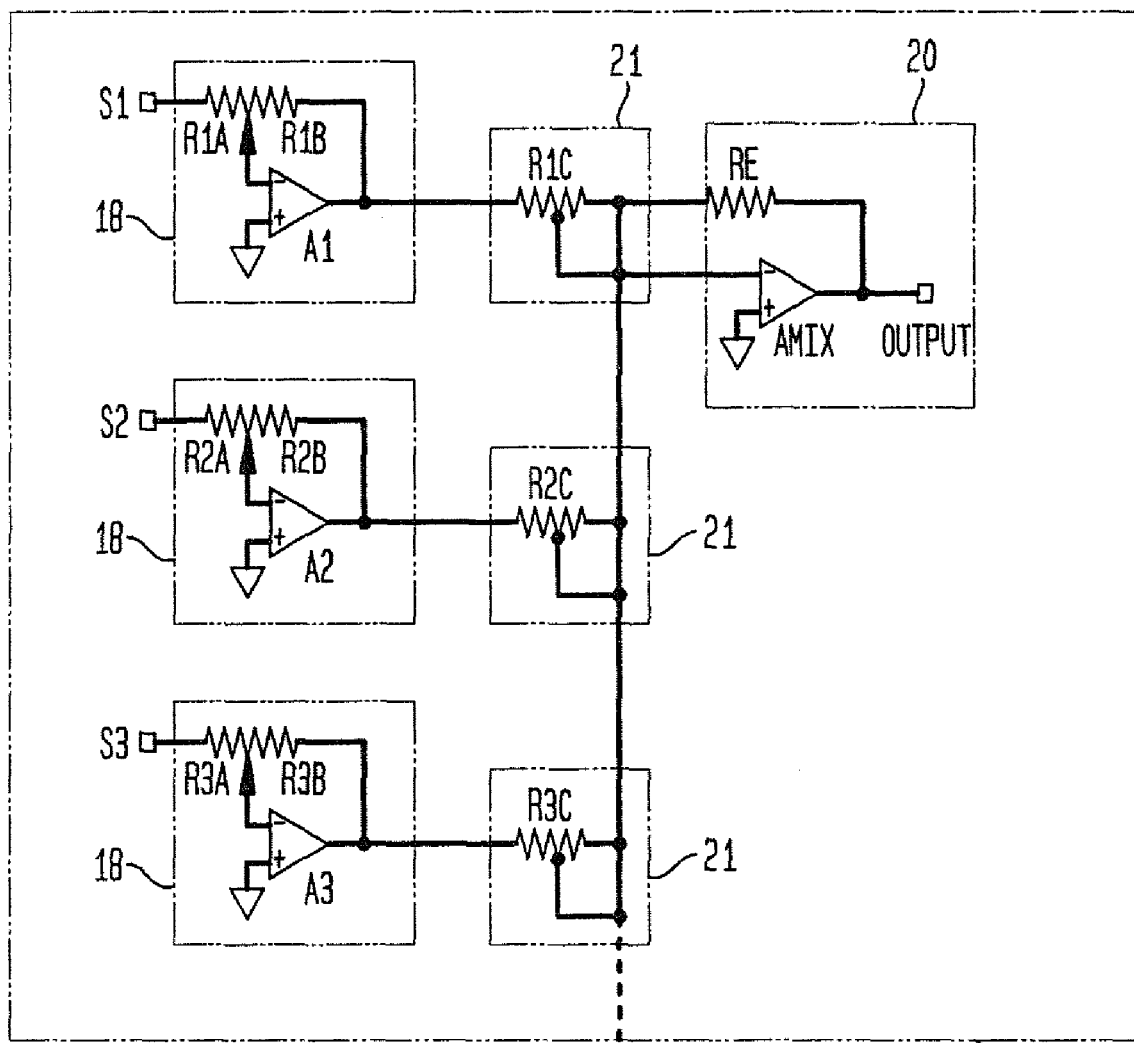
FIG. 2 shows a conventional, independently buffered, high-impedance input, variable-input-gain mixing circuit.

FIG. 2 shows a conventional, independently buffered, high-impedance input, variable-input-gain mixing circuit 19, suitable for mixing two or more low-impedance input signals into a single output signal, comprising two or more variable-gain amplification circuits 18, a fixed-gain amplifier back-end 20 and two or more fixed-gain amplifier front-ends 21.

Each variable-gain amplification circuit 18 comprises an operational amplifier A1, A2, A3, variable input resistors R1A, R2A, R3A and the corresponding variable output resistors R1B, R2B, R3B. The operational amplifiers A1, A2, A3 have a grounded non-inverting input. The variable input resistors R1A, R2A, R3A connect the input terminals S1, S2, S3 to the inverting inputs of the corresponding operational amplifiers A1, A2, A3. The variable resistors R1B, R2B, R3B connect the inverting inputs of the corresponding operational amplifiers A1, A2, A3 to their corresponding outputs. Each variable-gain amplification circuit 18 provides a high-impedance buffer to an input signal. Each variable-gain amplification circuit 18 also inverts and amplifies that input signal by an amount equal to the ratio of the resistance of the output resistor to the input resistor, i.e., a variable amplification gain of R1B/R1A, or equivalent.

The back-end 20 of a fixed-gain amplifier comprises an operational amplifier AMIX, a resistor RE and an output terminal. The non-inverting input of operational amplifier AMIX is grounded. The resistor RE connects the inverting input of operational amplifier AMIX to the output terminal.

The front-ends 21 of fixed-gain amplifiers each comprise a fixed resistor connected so that signals applied at terminal S1, S2, S3 have corresponding resistance values R1C, R2C, R3C as the input resistance of the fixed amplifier. The output signal is therefore a mixture of the signals applied at input terminals S1, S2, S3, each amplified by the corresponding ratio R1B·RE/(R1A·R1C), R2B·RE/(R2A·R2C), and R3B·RE/(R3A·R3C). In general, for an input signal N, if RNC is equal to RNE, then each input signal N is amplified by an amount RNA/RNB.

The conventional, independently buffered, high-impedance input, variable-input-gain mixing circuit 19 also has the advantage that the gain of the signal in each input channel can be independently adjusted. A disadvantage of such a circuit is that it too requires an operational amplifier for each signal being mixed, in addition to the operational amplifier required for the mixing.

There are many signal mixing applications that are both cost sensitive and do not require the full flexibility of the previously described mixing circuits. Consumer electronics devices, such as cell phones, are becoming available that have multiple audio sources, such as, but not limited to, AM, FM and satellite radio, tone and ring synthesizers, MP3 players and microphone inputs. It is sometimes desirable to mix two or more such audio sources into a single output channel, such as a headset phone. For instance, two people conversing on a phone may also want to listen to background music and require that the music audio source is mixed in with the audio of their conversation.

Consumer electronic devices are very price sensitive, making it highly desirable that any such mixing capability is provided as inexpensively as possible, which typically means using as few components as possible. The mixing requirements of such circuits are also not as stringent as for other mixing applications. In particular, consumer electronic devices typically only require three circuit selection and mixing capabilities. The first is the ability to select a channel and to adjust the gain of the signal in that selected channel. The second is the ability to select a combination of channels, to mix them together and to apply the same gain to all the signals from the selected channels. The third is the ability, when a number of channels are selected and the signals from them mixed, to select a further subset of one of more channels, and to a apply a uniform gain to the signals from the selected subset while the gain of the signals from the remaining channels remains fixed.

Figure 3:
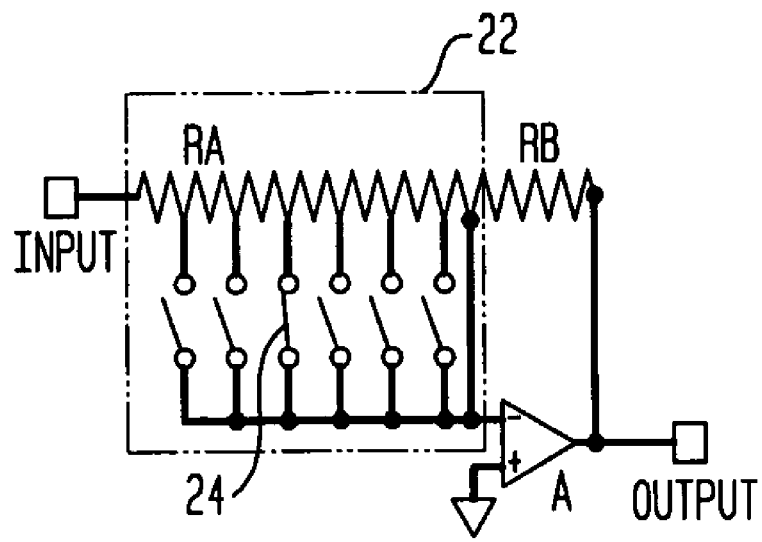
FIG. 3 is a schematic representation of a tapped resistor used as the front-end of a variable-input-resistance amplifier.

FIG. 3 is a schematic representation of a tapped resistor 22 used as the back-end of a variable-input-resistance amplifier capable of meeting the first of the consumer electronics mixing requirements. The circuit of FIG. 3 may also be used as part of the circuits, detailed later, that meet the further consumer electronics mixing requirements using only a single operational amplifier.

The tapped resistor 22 comprises a resistance having a multiplicity of switchable taps including tap 24. As back-end of a variable-input amplifier, tapped resistor has one end connected to an input and a tap connected to the inverting input of an operational amplifier A, such that when tap 24 is closed, the input resistance is provided by resistor RA, between closed tap 24 and the input. In the circuit of FIG. 3, the output resistance is provided by resistor RB. The gain of the variable-input-resistance amplifier circuit is the ratio of output resistance to input resistance, i.e., RB/RA.

Figure 4:
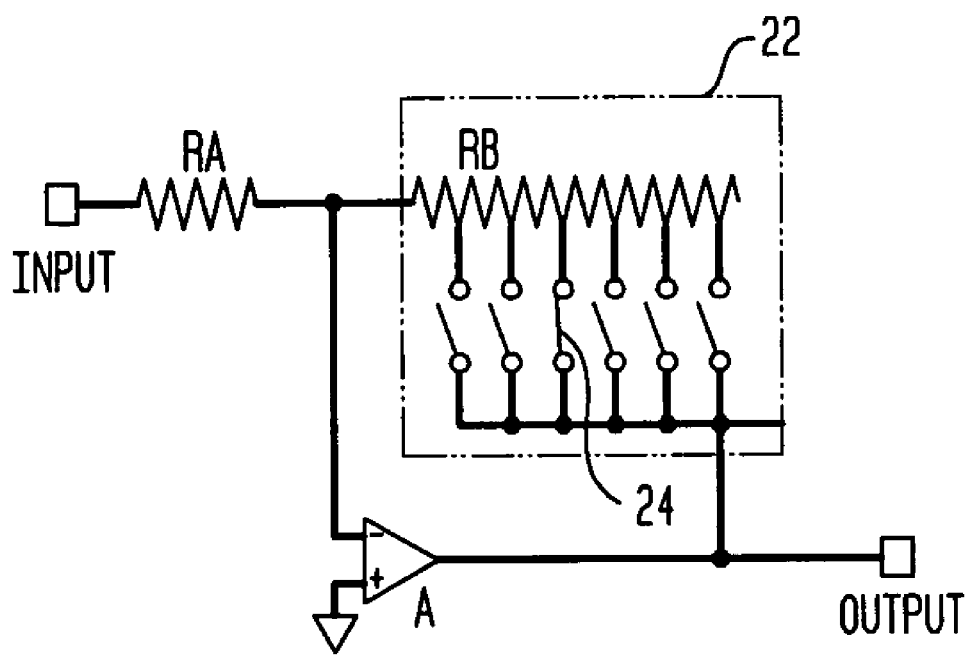
FIG. 4 is a schematic representation of a tapped resistor used as the back-end of a fixed-input-resistance amplifier circuit.

FIG. 4 is a schematic representation of a tapped resistor 22 used as the back-end of a fixed-input-resistance amplifier circuit. The gain of the fixed-input-resistance amplifier circuit of FIG. 4 is given by the ratio of the output resistance RB to the input resistance RA, i.e., RB/RA, with RB being dependent on which tap is set to be a closed tap 24.

Figure 5:
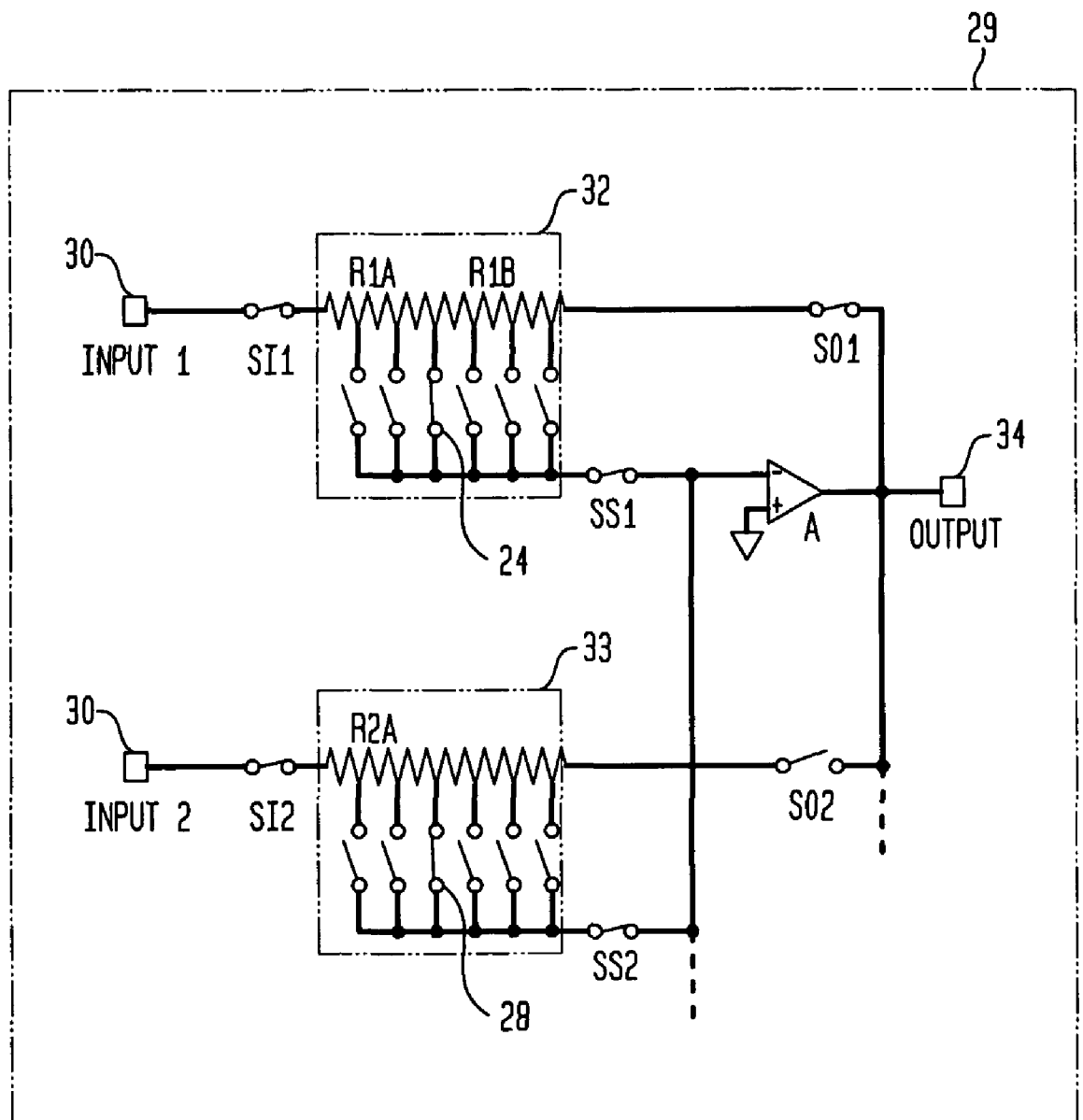
FIG. 5 shows a schematic representation of an exemplary single operational amplifier mixing circuit.

FIG. 5 shows a schematic representation of an exemplary single operational amplifier mixing circuit 29 of the present invention, designed to meet the first two consumer electronic mixing requirements. The single operational amplifier mixing circuit 29 comprises input contacts 30, input switches SI1 and SI2, tapped resistors 32 and 33, selection switches SS1 and SS2, operational amplifier A, output switches SO1 and SO2, and output contact 34.

The single operational amplifier mixing circuit 29 in FIG. 5 is shown set up to accomplish the second of the consumer electronic mixing requirements, i.e., to mix two signals together while applying the same gain to both signals. This equal gain mixing is accomplished by having substantially identical tapped resistors 32 and 33, with substantially corresponding tap positions 24 and 28 selected, so that the resistance R1A between input 1 and closed tap 24 has substantially the same value as resistance R2A between input 2 and closed tap 28. In addition, switches SO1, SS1 and SS2 are closed, while SO2 is open. In this way the output contact 34 is connected to the inverting input of the operational amplifier via closed tap 24 of tapped resistor 32, making the resistance R1B the output resistance for both signals. The signals at input 1 and input 2 are connected to the inverting input of the operational amplifier A by a substantially equal resistance R1A (which is equal to R2A). The gain for both signals is therefore the same and is the ratio of the output resistance R1B to the input resistance R1A.

Although the circuit in FIG. 5 has only two input channels, one of ordinary skill in the art will appreciate that the exemplary circuit 29 may be modified to include any number of inputs.

The single operational amplifier mixing circuit 29 in FIG. 5 may be set up to accomplish the first of the consumer electronic mixing requirements, i.e., select one signal and adjust its gain, by opening switch SS2. In that way, only the signal at input 1 would be selected and its gain could be varied by which of the taps is selected to be the closed tap 24, with the gain being given by the ratio of operational amplifier output resistance over input resistance, i.e., R1B/R1A.

One of ordinary skill in the art will readily appreciate that by closing corresponding switches SSN and SON, where N is an integer, and leaving all other switches SSM and SOM open, where M is an integer that is not N, the Nth input channel can be selected and the corresponding signal amplified by RNB/RNA.

Figure 6:
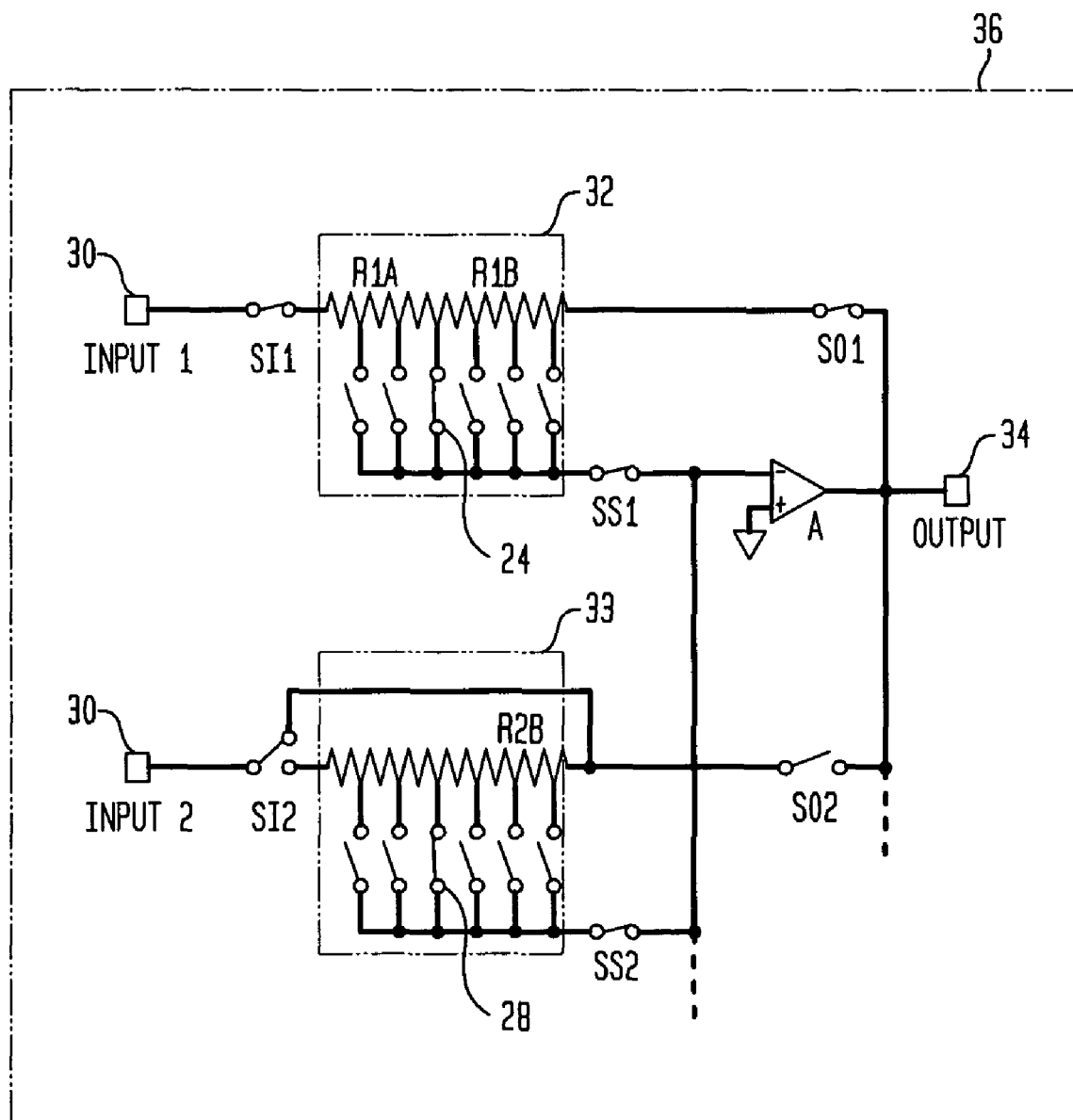
FIG. 6 shows an exemplary embodiment of a single operational amplifier switchable-mode mixing circuit.

FIG. 6 shows an exemplary embodiment of a single operational amplifier switchable-mode mixing circuit 36, designed to meet all three consumer electronic mixing requirements detailed above.

The single operational amplifier switchable-mode mixing circuit 36 comprises input contacts 30, input switches SI1 and SI2, tapped resistors 32 and 33, selection switches SS1 and SS2, operational amplifier A, output switches SO1 and SO2, and output contact 34.

The single operational amplifier switchable-mode mixing circuit 36 differs from the single operational amplifier mixing circuit 29 in that switch SI2 is a three-state switch, capable of performing one of isolating input 2; connecting input 2 to a first end of tapped resistor 33, corresponding to the connections in circuit 29; or connecting input 2 to a second end of tapped resistor 33, as shown in FIG. 6.

In FIG. 6 the single operational amplifier switchable-mode mixing circuit 36 is shown set up to accomplish the third of the consumer electronic mixing requirements, i.e., to mix two signals and apply a variable-gain to one signal while keeping the gain of the second signal fixed. This mode of mixing is accomplished by having substantially identical tapped resistors 32 and 33, with substantially corresponding tap positions 24 and 28 selected. Switch SI1 is set to connect input 1 to a first end of tapped resistor 32 while switch SI2 is set to connect input 2 to the second end of tapped resistor 33. In this way, signal 1 sees an input resistance of R1A while signal 2 sees an input resistance of R2B. In addition switches SO1, SS1 and SS2 are closed, while switch SO2 is open. In this way the output contact 34 is connected to the inverting input of the operational amplifier via closed tap 24 of tapped resistor 32, making the resistance R1B the feedback resistance for both signals. The signal at input 1 has an input resistance R1A and a feedback resistance R1B, and is therefore amplified by a factor of R1B/R1A. The signal at input 2 has an input resistance R2B and a feedback resistance R1B. As long as variable resistors 32 and 33 are substantially the same and ganged together, i.e., that the closed taps 24 and 28 both divide the resistors in the same ratio, resistance R2B is substantially equal to resistance R1B. The gain of signal 2 is R1B/R2B, which for the conditions specified above, is unity. As long as tapped resistors 32 and 33 are ganged, the gain on signal 1 can be varied dependent on which of the taps is selected to be the closed tap 24, while the gain on signal 2 remains unity.

Although the single operational amplifier switchable-mode mixing circuit 36 is shown with only two inputs, one of skill in the art will appreciate that the single operational amplifier switchable-mode mixing circuit 36 may be modified to include any number of inputs, and may be set up to fulfill any of the three consumer electronic mixing requirements detailed above.

An advantage of the single operational amplifier switchable-mode mixing circuit 36 is that only one operational amplifier is used, considerably reducing the cost of such circuit compared to the cost of a circuit of the sort shown in FIGS. 1 and 2, while enabling three modes of mixing that are useful in consumer electronics applications.

Figure 7:
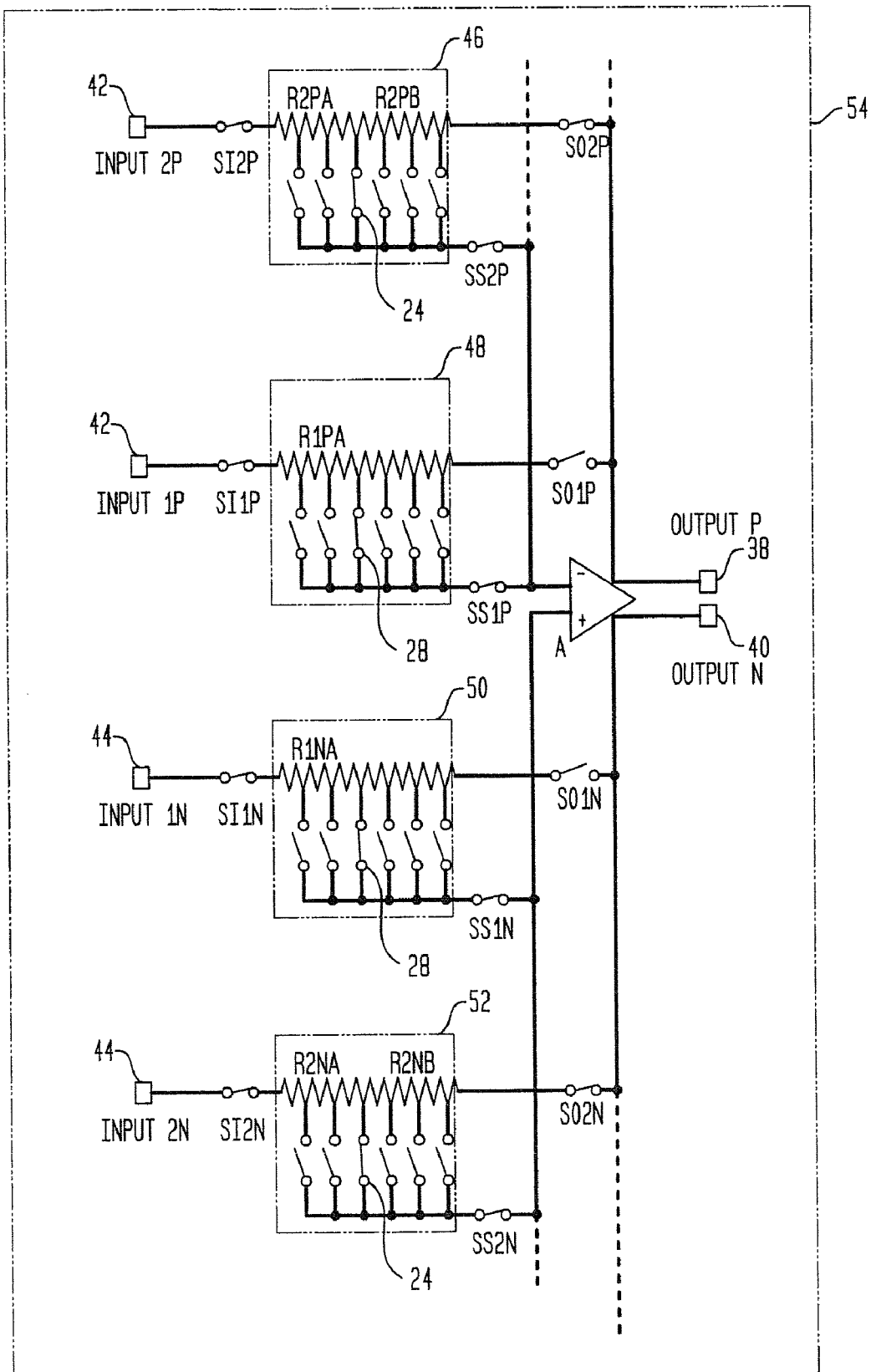
FIG. 7 shows a schematic representation of an exemplary single operational amplifier mixing circuit with differential input and differential output.

FIG. 7 shows a schematic representation of an exemplary differential-input, differential-output, single operational-amplifier mixing circuit 54.

The differential-input differential-output, single operational-amplifier mixing circuit 54 comprises positive input contacts 42, negative input contacts 44, input switches SI1P, SI1N, SI2P and SI2N, tapped resistors 46, 48, 50 and 52, selection switches SS1P, SS1N, SS2P and SS2N, operational amplifier A, output switches SO1P, SO1N, SO2P and SO2N, positive output contact 38 and negative output contact 40.

The differential-input and differential-output, single operational-amplifier mixing circuit 54 in FIG. 7 is shown set up to accomplish the second of the consumer electronic mixing requirements, i.e., to mix two signals together while applying the same gain to both signals. A first differential-input signal is applied to input 1P and 1N, while a second differential-input is applied to input 2P and 2N. The equal gain mixing is accomplished by having substantially identical tapped resistors 46, 48, 50 and 52, with substantially corresponding tap positions 24 and 28 selected, so that the resistances values of resistances R1PA, R2PA, R1NA and R2NA are substantially the same. In addition, switches SS1P, SS1N, SS2P, SS2N, SO2P, SO2N are closed, while switches SO1N and SO1P are open. In this way the non-inverting output 38 is connected to the inverting input of the operational amplifier via closed tap 24 of tapped resistor 46, making the resistance R2PB the output resistance for both positive portions of the differential-input signals. In addition, the inverting output 40 is connected to the non-inverting input of the operational amplifier via closed tap 24 of tapped resistor 52, making the resistance R2NB the output resistance for both negative portions of the differential-input signals. The positive parts of differential-input signals at 1P and 2P are connected to the inverting input of the operational amplifier A by substantially equal resistances R1PA and R2PA. The negative parts of differential-input signals at 1N 1 and 2N are connected to the inverting input of the operational amplifier A by substantially equal resistances R1NA and R2NA. The gain for both the positive and negative portions of both differential-input signals is therefore the same and is the ratio of the output resistance R2PB to the input resistance R2PA, which is substantially the same as the ratio of R2NB to R2NA.

Although the circuit 54 in FIG. 7 has only two differential-input channels, one of ordinary skill in the art will appreciate that the exemplary circuit 54 may be modified to include any number of inputs.

Although the circuit 54 in FIG. 7 is shown set up to meet the second of the consumer electronics mixing requirements, one of ordinary skill in the art will appreciate that circuit 54 may be modified along the lines of circuit 36 in FIG. 6 to meet all three consumer electronic mixing requirements detailed above.

Figure 8:
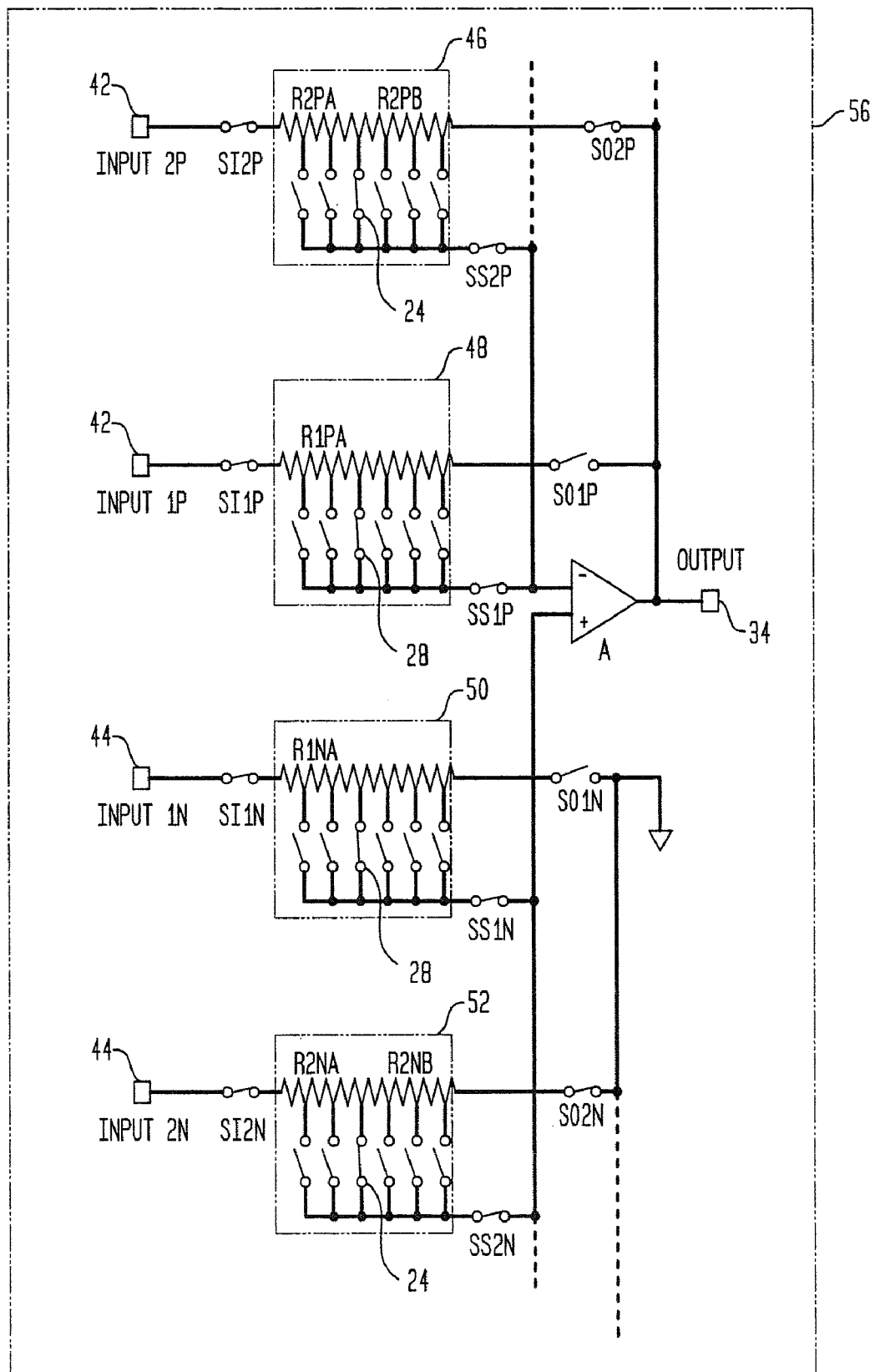
FIG. 8 shows a schematic representation of an exemplary single operational amplifier mixing circuit with differential input and common output.

FIG. 8 shows a schematic representation of an exemplary, differential-input, common-output, single operational-amplifier mixing circuit 56.

The differential-input, common-output, single operational-amplifier mixing circuit 56 differs from the exemplary differential-input, differential-output, single operational-amplifier mixing circuit 54 in that the operational amplifier A has only one output 34, and the negative parts of the differential-input signals are effectively connected to ground via resistance R2NB of tapped resistor 52 via closed switch SO2N.

Although the circuit 56 in FIG. 8 has only two differential-input channels, one of ordinary skill in the art will appreciate that the exemplary circuit 56 may be modified to include any number of inputs.

Systems having differential-input signals, as shown in circuit 56, and systems having both differential-input and differential-output signals, as shown in circuit 54, both have the advantage of being less sensitive to noise in the input signal and/or producing less distortion in the output signal.

Although the circuit 56 in FIG. 8 has only two differential input channels, one of ordinary skill in the art will appreciate that the exemplary circuit 56 may be modified to include any number of inputs.

Although the circuit 56 in FIG. 8 is shown set up to meet the second of the consumer electronics mixing requirements, one of ordinary skill in the art will appreciate that circuit 54 may be modified along the lines of circuit 36 in FIG. 6 to meet all three consumer electronic mixing requirements detailed above.

Systems having differential input signals, as shown in circuit 56, and systems having both differential input and output signals, as shown in circuit 54, both have the advantage of being less sensitivity to noise in the signal and or producing less distortion of the signal.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. An apparatus for mixing a plurality of input signals, comprising:
   an operational amplifier;
   a first tapped-resistor having a tap connected to a first input of said operational amplifier, a first end connected to a first input terminal, and a second end switchably connected to a first output of said operational amplifier; and
   a second tapped-resistor having a tap connected to the first input of said operational amplifier, a first end connected to a second input terminal, and a second end switchably connected to the first output of said operational amplifier.

2. The apparatus of claim 1 wherein said first and second tapped-resistors are substantially identical and wherein said taps of said first and second tapped-resistors are ganged.

3. The apparatus of claim 1, further comprising a first input signal connected to said first input terminal, and a second input signal connected to said second input terminal, wherein a signal at the output of said operational amplifier has a mixture of said first and second input signals in which each of said signals is amplified by an amount equal to a ratio of a tap-to-second-end resistance over a tap-to-first-end resistance of said tapped resistors.

4. The apparatus of claim 1, wherein said second end of said second tapped-resistor is switchably connected to said second input terminal.

5. The apparatus of claim 4, further comprising a first input signal connected to said first input terminal, and a second input signal connected to said second input terminal, thereby providing a signal at the output of said operational amplifier having a mixture of said first and second input signals in which said first signal is amplified by an amount equal to a ratio of a tap-to-second-end resistance over a tap-to-first-end resistance of said first tapped resistor and said second signal is amplified by an amount equal to the ratio of said tap-to-second-end resistance of said first tapped resistor to a tap-to-second-end resistance of said second tapped resistor.

6. The apparatus of claim 5, wherein said tap-to-second-end resistance of said first tapped resistor is substantially equal to said tap-to-second-end resistance of said second tapped resistor, thereby providing essentially unit amplification to said second signal.

7. The apparatus of claim 1 further comprising:
   a third tapped-resistor having a tap connected to a second input of said operational amplifier, a first end connected to a third input terminal and a second end connected to a second output of said operational amplifier; and
   a fourth tapped-resistor having a tap connected to the second input of said operational amplifier, a first end connected to a fourth input terminal and a second end connected to the second output of said operational amplifier.

8. The apparatus of claim 7 further comprising:
   a first differential input signal having a positive part connected to said first input terminal and a negative part connected to said third input terminal; and
   a second differential input signal having a positive part connected to said second input terminal and a negative part connected to said fourth input terminal, thereby providing a differential output signal at the first and second outputs of said operational amplifier having a mixture of said first and second differential input signals both amplified by an amount equal to a ratio of a tap-to-second-end resistance over a tap-to-first-end resistance of said tapped resistors.

9. The apparatus of claim 2 further comprising:
a third tapped-resistor having a tap connected to a second input of said operational amplifier, a first end connected to a third input terminal and a second end connected to ground; and
a fourth tapped-resistor having a tap connected to the second input of said operational amplifier, a first end connected to a fourth input terminal and a second end connected to ground.

10. The apparatus of claim 9 further comprising:
a first differential input signal having a positive part connected to said first input terminal and a negative part connected to said third input terminal; and
a second differential input signal having a positive part connected to said second input terminal and a negative part connected to said fourth input terminal, thereby providing an output signal at the output of said operational amplifier having a mixture of said first and second differential signals both amplified by an amount equal to a ratio of a tap-to-second-end resistance over a tap-to-first-end resistance of said tapped resistors.

11. A method for mixing a plurality of input signals, comprising the steps of:
connecting an input of an operational amplifier to a tap connection of first and second tapped-resistors;
connecting a first end of said first tapped-resistor to a first input terminal;
connecting a first end of said second tapped-resistor to a second input terminal;
switchably connecting the second end of said first tapped-resistor to an output of said operational amplifier; and
switchably connecting the second end of said second tapped-resistor to the output of said operational amplifier.

12. The method of claim 11 wherein said first and second tapped-resistors are substantially identical and wherein said taps of said first and second tapped-resistors are ganged.

13. The method of claim 11, further comprising the steps of connecting a first input signal to said first input terminal, and connecting a second input signal to said second input terminal, wherein a signal at the output of said operational amplifier has a mixture of said first and second input signals in which each of said signals is amplified by an amount equal to a ratio of a tap-to-second-end resistance over a tap-to-first-end resistance of said tapped resistors.

14. The method of claim 11, further comprising the step of switchably connecting said second end of said second tapped-resistor to said second input terminal.

15. The method of claim 14, further comprising the steps of connecting a first input signal to said first input terminal, and connecting a second input signal to said second input terminal, thereby providing a signal at the output of said operational amplifier having a mixture of said first and second input signals in which said first signal is amplified by an amount equal to a ratio of a tap-to-second-end resistance over tap-to-first-end resistance of said first tapped resistor and said second signal is amplified by an amount equal to the ratio of said tap-to-second-end resistance of said first tapped resistor to a tap-to-second-end resistance of said second tapped resistor.

16. The method of claim 15, wherein said tap-to-second-end resistance of said first tapped resistor is substantially equal to said tap-to-second-end resistance of said second tapped resistor, thereby providing essentially unit amplification to said second signal.

17. A system for mixing a plurality of input signals, comprising:
an amplifier means;
a first variable resistance means capable of dividing a resistance into a first resistance and a second resistance, said first resistance being connected so as to provide an input resistance of said amplifier means, and said second resistance being connected so as to provide a feedback resistance of said amplifier means; and
a second variable resistance means capable of dividing a resistance into a first resistance and a second resistance, being switchably connected to said amplifier means so that either said first or second resistance of said second variable resistance means may be selected to be an input resistance of said amplifier means, and wherein said first and second variable resistance means are substantially identical and are ganged together so the ratio of said first resistance to said second resistance remains substantially the same for both variable resistance means.

18. The system of claim 17, wherein said first resistance of said second variable resistance means is selected to be an input resistance of said amplifier means.

19. The system of claim 18, further comprising a first input signal connected to said first variable resistance means, and a second input signal connected to said second variable resistance means, thereby providing a signal at the output of said amplifier means having a mixture of said first and second input signals in which each of said signals is amplified by an equal amount.

20. The system of claim 17, wherein said second resistance of said second variable resistance means is selected to be an input resistance of said amplifier means.

21. The system of claim 20, further comprising a first input signal connected to said first variable resistance means, and a second input signal connected to said second variable resistance means, thereby providing a signal at the output of said amplifier means having a mixture of said first and second input signals in which said first signal is amplified by an amount equal to a ratio of said second resistance of said first variable resistance means over said first resistance of said first variable resistance means and said second signal is amplified by essentially unit amplification.

22. The apparatus of claim 1, wherein said first input of said operational amplifier is an inverting input.

23. The apparatus of claim 1, wherein said first output of said operational amplifier is a non-inverting output.

24. The apparatus of claim 7, wherein said second input of said operational amplifier is a non-inverting input.

25. The apparatus of claim 7, wherein said second output of said operational amplifier is an inverting output.

\* \* \* \* \*